(12) United States Patent
Liu

(10) Patent No.: US 8,425,083 B2  
(45) Date of Patent: Apr. 23, 2013

(54) LED DIRECTIONAL ILLUMINATION ENERGY-SAVING LUMINAIRE AND MANUFACTURING METHOD THEREOF

(76) Inventor: Zhiyong Liu, Fujian Province (CN)

( * ) Notice: Subject to any disclaimer, the term of this patent is extended or adjusted under 35 U.S.C. 154(b) by 715 days.

(21) Appl. No.: 12/599,040

(22) PCT Filed: Nov. 19, 2007

(86) PCT No.: PCT/CN2007/003254  
§ 371 (c)(1),  
(2), (4) Date: Nov. 6, 2009

(87) PCT Pub. No.: WO2008/138185  
PCT Pub. Date: Nov. 20, 2008

(65) Prior Publication Data  
US 2010/0302780 A1    Dec. 2, 2010

(30) Foreign Application Priority Data  
May 15, 2007    (CN) .......................... 2007 1 0008968

(51) Int. Cl.  
*F21V 21/00*    (2006.01)

(52) U.S. Cl.  
USPC ................. 362/249.06; 362/249.02; 362/545; 257/88; 313/500

(58) Field of Classification Search ............. 362/249.02, 362/249.06, 545; 313/500; 257/88  
See application file for complete search history.

(56) References Cited

U.S. PATENT DOCUMENTS 8,025,428 B2 * 9/2011 Duguay et al. ........... 362/249.02  
2006/0257205 A1 * 11/2006 Jordan et al. .................... 404/16

* cited by examiner

*Primary Examiner* — Stephen F Husar

(57) ABSTRACT

A LED directional illumination energy-saving luminaire and a manufacturing method thereof. The luminaire comprises: a circuit board with an X direction and a Y direction defined; and illumination units including a first illumination unit arranged at the center of the circuit board, and two second illumination units arranged at both sides of the first illumination unit. Each illumination unit includes LEDs mounted to said circuit board in a tilted state with said LED bodies positioned at a predetermined height from the circuit board, and said LEDs are arranged at intervals in an array along said X direction and Y direction and distributed with respect to the center of said array. Each LED deviates from both X and Y directions at a predeterminative angle, so that the illumination units can form predeterminative project angles in the X direction and the Y direction respectively.

9 Claims, 7 Drawing Sheets ic # LED DIRECTIONAL ILLUMINATION ENERGY-SAVING LUMINAIRE AND MANUFACTURING METHOD THEREOF

BACKGROUND OF THE INVENTION

The present invention relates to a directional illumination energy-saving luminaire using light-emitting diodes (LEDs), and more particularly, it pertains to a LED directional illumination energy-saving luminaire for roads lighting, that adopts LEDs having small projection angles and being slantwise mounted at a predetermined angle as light-emitting elements, and is capable of achieving an accurate directional illumination, a well lighting effect, an energy-saving effect, and a well performance of heat dissipation. The present invention also relates to a method for manufacturing said LED directional illumination energy-saving luminaire.

A LED luminaire is a kind of high efficiency, energy-saving luminaire that has an ultra-long service life, currently utilized in many areas, for example, street lighting, industrial lighting, stage lighting, landscape decorative lighting, and indoor lighting.

As is well-known, with respect to street lamps for the lighting of the road surface such as highroad, express highway, urban street and the like, to minimize effects of glare on the driver, it is necessary to use cut-off luminaires that are designed and manufactured according to national standards for the design of street lighting and have an angle of light projection of 120 degrees, such as those which are made by providing a reflex lampshade with the conventional flood-type street lamps like the high-voltage sodium lamps etc., and that have a light projection angle of 120 degrees. Presently, the lighting street lamps using LEDs applied in the field of road lighting, for the purpose of meeting the requirements by national standards for the design of street lighting, mostly are such luminaires that are made by adopting the LED with a large light projection angle as the light-emitting elements and that have a projection angle of 120 degrees.

The deficiencies of the conventional lighting street lamps are as follows:

With the conventional lighting street lamp, a large portion of the illumination emitted by the light source thereof is projected onto the outside of the road surface that needs no lighting, while the road surface that does need lighting can merely receive a luminous flux that is less than half of the total amount of illumination given by the light source. Thus the utilization ratio of lamp illumination is very low, resulting in the loss of light and the waste of electric energy. In addition, the illumination that is projected outside of the road surface may even further give rise to an undesirable light pollution.

Hereinafter, a detailed description will be set forth with reference to the schematic views. As shown in FIG. 1 and FIG. 2, the lighting street lamp 1 is mounted on the lamp post 101, for lighting the road surface of the street 102. The projection angle of the street lamp 1 is 120 degrees, the encircled portion 103 represents an area of a projecting circular region of the lamp 1, a hatched portion 104 represents an area of the road surface that is illuminated by the lamp 1, i.e., the actually utilized portion of the projected light, and a hatched portion 105 represents the area of the outside of the road surface that is illuminated by the lamp 1, i.e., the wasted portion of the projected light. From the above mentioned schematic views, it can be clearly seen that, the wasted portion of the light due to the illumination onto the outside of the road surface occupies a significant proportion in the luminous flux projected by the light source. In the table below, relevant data are listed for the street lamps which have a mounting height of 5-12 meters and are utilized for the lighting of roads with a width of 6-10 meters.

| Mounting height of street lamp (meter) | Width of road surface (meter) | Illuminating radius (meter) | Area of lamp illumination circle (square meter) | Area of road surface illuminated (square meter) | Utilization ratio of lamp illumination |
|---|---|---|---|---|---|
| 5 | 6 | 8.66 | 235.62 | 103.92 | 44.11% |
| 6 | 6 | 10.39 | 339.29 | 124.68 | 36.75% |
| 7 | 8 | 12.12 | 461.81 | 193.92 | 41.99% |
| 8 | 8 | 13.86 | 603.19 | 221.70 | 36.76% |
| 9 | 10 | 15.59 | 763.41 | 311.77 | 40.84% |
| 10 | 10 | 17.32 | 942.48 | 346.41 | 36.76% |
| 11 | 10 | 19.05 | 1140.40 | 381.05 | 33.41% |
| 12 | 10 | 20.78 | 1357.17 | 415.69 | 30.63% |

In conventional LED lighting street lamps, since a reflex lampshade is adopted for reflecting light, the illumination is uneven, the illuminating intensity directly under the luminaire is relatively high, while the illuminating intensity far from the luminaire is relative low. The ununiformity of road surface lighting is prone to having a disadvantageous influence to the driver, giving rise to risks of traffic accidents.

In the conventional LED lighting street lamps, since LEDs with large projection angles are adopted, the phenomenon of light scattering is serious, the capability of transmission is weak, the mounting height is limited, and it is difficult to achieve a long distance illumination.

In the conventional LED lighting street lamps with high power, there is a great amount of heat generated during working of the LED which would not easily dissipate outside, and there lacks an effective structure for heat dissipation, thus temperature of the LED rises quickly, so the luminous efficiency thereof is reduced and the service life thereof is shortened.

BRIEF SUMMARY OF THE INVENTION

The object of the present invention is to overcome the deficiencies of the prior art, and provide a LED directional illumination energy-saving luminaire, that is capable of achieving an accurate directional illumination, has a well lighting effect and energy-saving effect, and has a well performance of heat dissipation.

Another object of the present invention is to provide a method for manufacturing a LED directional illumination energy-saving luminaire.

For this purpose, the present invention provides a LED directional illumination energy-saving luminaire, characterized in that, it comprises: a plane circuit board with an X direction and a Y direction defined; and illumination units comprising a plurality of LEDs mounted to said circuit board in a tilted state with LED bodies being positioned at a predetermined height from the plane circuit board, and said plurality of LEDs are arranged in an array with predetermined intervals therebetween in said X direction and said Y direction and are symmetrically distributed with respect to the center of said array, each of said LEDs is deviated by a predetermined angle with respect to said X direction and said Y direction, thereby allowing said illumination units having predetermined projection angles in said X direction and said Y direction, respectively.

Further, said illumination units comprise a first illumination unit located in the middle area of said circuit board and second illumination units that are symmetrically arranged at both sides of said first illumination unit, each of said illumination units comprise a plurality of LEDs mounted to said circuit board in a tilted state with LED bodies being positioned at a predetermined height from the plane circuit board, said plurality of LEDs of each of said illumination units are arranged in an array with predetermined intervals therebetween along said X direction and said Y direction and are symmetrically distributed with respect to the center of said array, each of said LEDs is deviated by a predetermined angle with respect to said X direction and said Y direction, thereby allowing said illumination units having predetermined projection angles in said X direction and said Y direction, respectively.

Further, the slantwise angle $\alpha_n$ of each of said LEDs as viewed in the section which is perpendicular to the plane circuit board and extends along said X direction, is governed by the following formula:

$$\alpha_n = \text{Arc}tg(tg55 \cdot (n-0.5)/(N/2-0.5))$$

wherein: N is the total columns of said LEDs arranged along said X direction, and n is the sequence number of the column within which said LED is located, counted in the order from the center of the array of the LEDs towards the outside along said X direction; and the slantwise angle $\beta_m$ of each of said LEDs as viewed in the section which is perpendicular to the plane circuit board and extends along said Y direction, is governed by the following formula:

$$\beta_m = \text{Arc}tg(W \cdot (m-0.5)/M/H)$$

wherein: W is an illumination width of said luminaire along said Y direction, M is the total rows of said LEDs arranged along said Y direction, m is the sequence number of the row within which said LED is located, counted in the order from the center of the array of the LEDs towards the outside along said Y direction, and H is the mounting height of said luminaire.

Further, the projection angle of said illumination units in said X direction is 120 degrees.

Further, said LED is a LED with a projection angle less than or equal to 15 degrees.

Further, said LED is a LED with a luminous intensity higher than or equal to 20,000 mcd.

Further, said circuit board is formed thereon with a first illumination unit mounting region and second illumination unit mounting regions, in said first illumination unit mounting region and said second illumination unit mounting regions there are respectively provided with a plurality of pairs of insertion holes that are arranged at intervals along said X direction and said Y direction respectively, the arranging direction of said pairs of insertion holes in said first illumination unit mounting region and that of said pairs of insertion holes in said second illumination unit mounting regions are perpendicular with each other, and said LEDs are inserted into said pairs of insertion holes of said circuit board and welded therein.

Further, said plurality of LEDs of said illumination units are divided into multiple groups that can be independently controlled.

Further, said circuit board has multiple groups of common power supply line patterns that are mutually independent, each group of said common power supply line patterns has an independent terminal.

Further, said common power supply line pattern has a laterally widened portion with a square-wave-like profile.

Further, it also comprises: a lamp body, which has a hollow shell formed by a pedestal and a transparent lampshade; and an apertured substrate for mounting said circuit board, as the substrate being provided within said shell and forming heat dissipation channels between itself both with said pedestal and with said transparent lampshade.

There is also provided a method for manufacturing a LED directional illumination energy-saving luminaire, comprising the following steps:

Step 1: providing a plane circuit board with an X direction and a Y direction defined;

Step 2: mounting a plurality of LEDs on said circuit board at intervals along said X direction and said Y direction to form illumination units, with the body of each of said LEDs at a height of 8-10 mm from the plane circuit board;

Step 3, making the body of each of said LEDs tilted and respectively deviated by a predetermined angle with respect to said X direction and said Y direction, so that said illumination units form predetermined projection angles in said X direction and said Y direction, respectively.

As compared with conventional LED lighting luminaires, the LED directional illumination energy-saving luminaire of the present invention provides the following beneficial effects:

First, due to the unique arrangement of the LEDs, a proper directional illumination is achieved, the predetermined range targeted can be accurately illuminated according to the requirement of lighting, and the utilization ratio of lamp illumination can be effectively improved. When used for street lighting, the light can be accurately projected onto the range of the road surface, the loss of light, the waste of electric energy and light pollution caused due to the illumination of the light outside of the road surface can be avoided, thus the energy consumption is sharply reduced, and the energy-saving effect is remarkable, and at least 80% of the energy consumption can be saved in comparison with the street lamp adopting a conventional high-voltage sodium lamp.

Second, by adopting a LED with a relatively small projection angle as the light-emitting element of the luminaire, the light scattering is greatly reduced, the intensity of light illumination is enhanced, and the deficiency of the conventional LED luminaire that the mounting height and distance of projection are limited is overcome. With the luminaire of the present invention, the mounting height thereof can be up to above 15-20 meters, so it is applicable to the field of high-post lamps for the big squares.

Third, the deficiency of the conventional luminaire that the illuminating intensity is uneven is overcome, and no reflex lampshade is needed. When used for street lighting, it can provide a uniform and well road illumination for the driver to make the feeling of driving more relaxed and less tired so as to minimize occurrence of traffic accidents.

Fourth, by adopting a LED element with low power and a low amount of heat generation, and mounting the body of the LED at a certain height from the plane circuit board, and arranging a plurality of LEDs at intervals in an array, the heat dissipation is made easy. Since the common power supply line pattern has a laterally widened portion with a square-wave-like profile, the section of the line pattern is increased, the current density is lowered, and the amount of heat generated is effectively reduced; heat dissipation channels are formed within the main body of the lamp, thus the internal air is in a convective state and flows smoothly. With the above design, the luminaire as a whole has a well performance of heat dissipation and a stable state of operation, and upon use, it is not needed to mount a heat dissipation device, thus the volume and weight of the luminaire can be greatly reduced, and the cost thereof is lowered.

Fifth, since the plurality of LEDs is divided into multiple groups that can be independently controlled, the timing control by group can be conveniently carried out according to different requirements for lighting.

Sixth, an AC power supply system or solar energy system can be adopted for supplying electricity. Upon the adoption of a solar energy system for supplying electricity, the components required by the system such as solar panels, accumulators and controllers etc. can be reduced by a half as compared with the conventional solar energy street lamp, thus the project investment can be greatly reduced, and the application of the solar energy street lamp can be facilitated, so as to aid in the popularization of the solar energy street lamp.

Seventh, the structure thereof is simple and rational, and the cost thereof is low, which is very suitable for a large-scale application, capable of substituting for the conventional high-voltage sodium lamp and conventional LED luminaries, and is an ideal energy-saving, environmentally friendly lighting product.

Hereinafter, the present invention is further described in connection with the accompany drawings and embodiments.

DETAILED DESCRIPTION OF THE INVENTION

Figure 1:
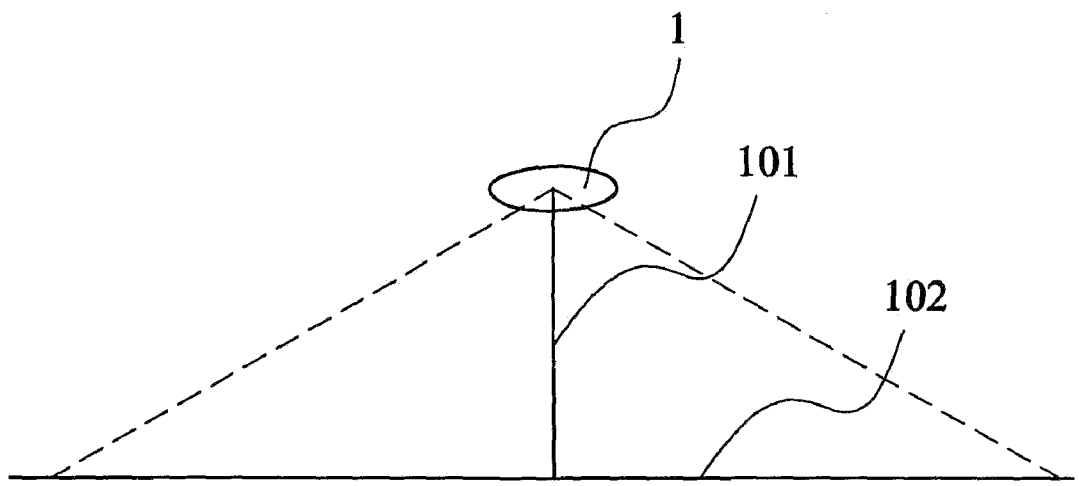
FIG. 1 is a side schematic view of a light projection of a conventional lighting street lamp.
Figure 2:
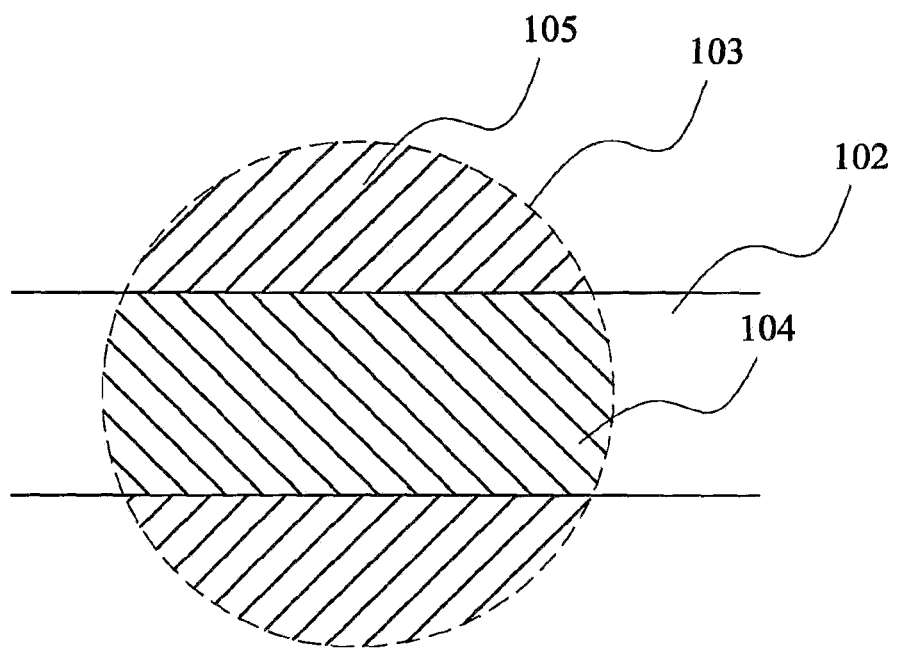
FIG. 2 is a planar schematic view of the light projection of the conventional lighting street lamp.
Figure 3:
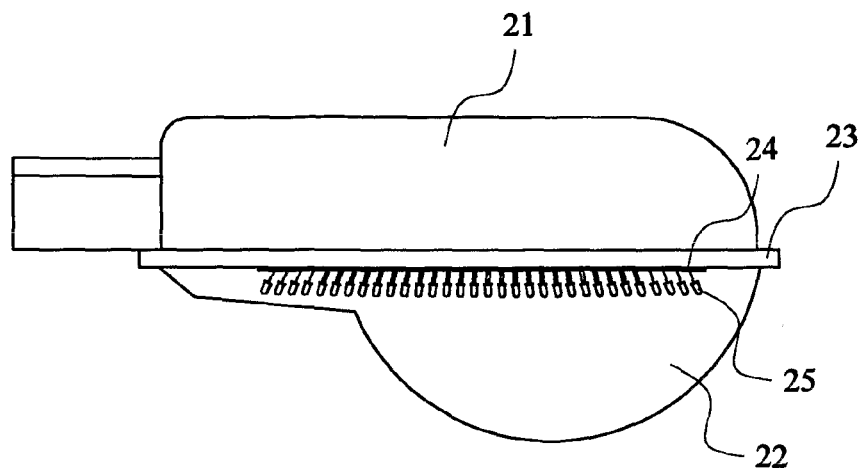
FIG. 3 is a schematic view of the LED directional illumination energy-saving luminaire provided by the present invention.
Figure 4:
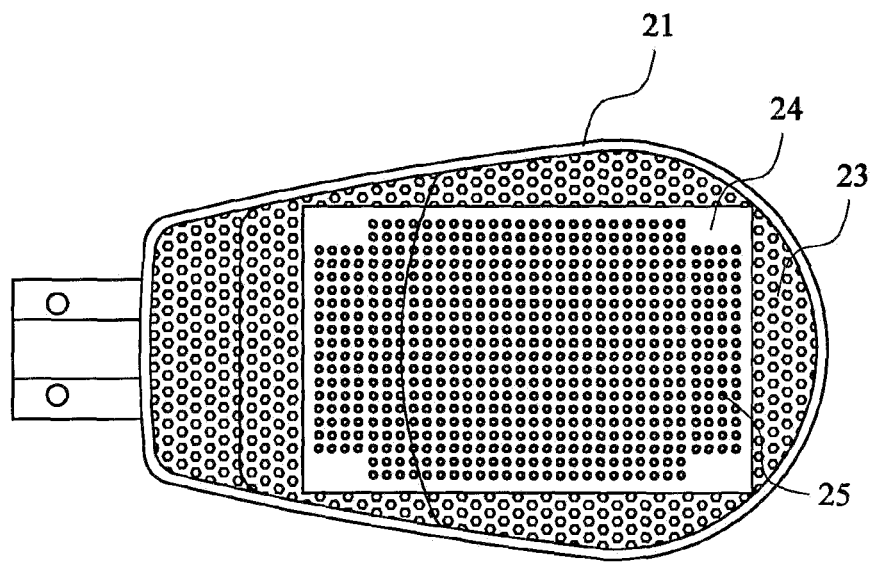
FIG. 4 is a view in the direction of arrow A in FIG. 3.

In FIG. 3 and FIG. 4, there is shown a LED directional illumination energy-saving luminaire for street lighting, the luminaire comprises a hollow shell formed by a pedestal 21 and a transparent lampshade 22, an apertured substrate 23 mounted within the shell, a printed circuit board 24 mounted on the apertured substrate 23, a plurality of LEDs 25 mounted on the printed circuit board 24. The pedestal 21 and the apertured substrate 23 can be made of aluminum or aluminum alloy, and the lampshade 22 is made of transparent polycarbonate. The apertured substrate 23 is positioned at a distance of more than 10 cm from both the pedestal 21 and the transparent lampshade 22. The apertures in the substrate 23, the gap between the substrate 23 and the pedestal 21 and that between the substrate 23 and the transparent lampshade 22 form heat dissipation channels that are helpful for air convection. The LED 25 is one that has a diameter of 5 mm, a projection angle less than 15 degrees, and a luminous intensity higher than 20,000 mcd.

Figure 5:
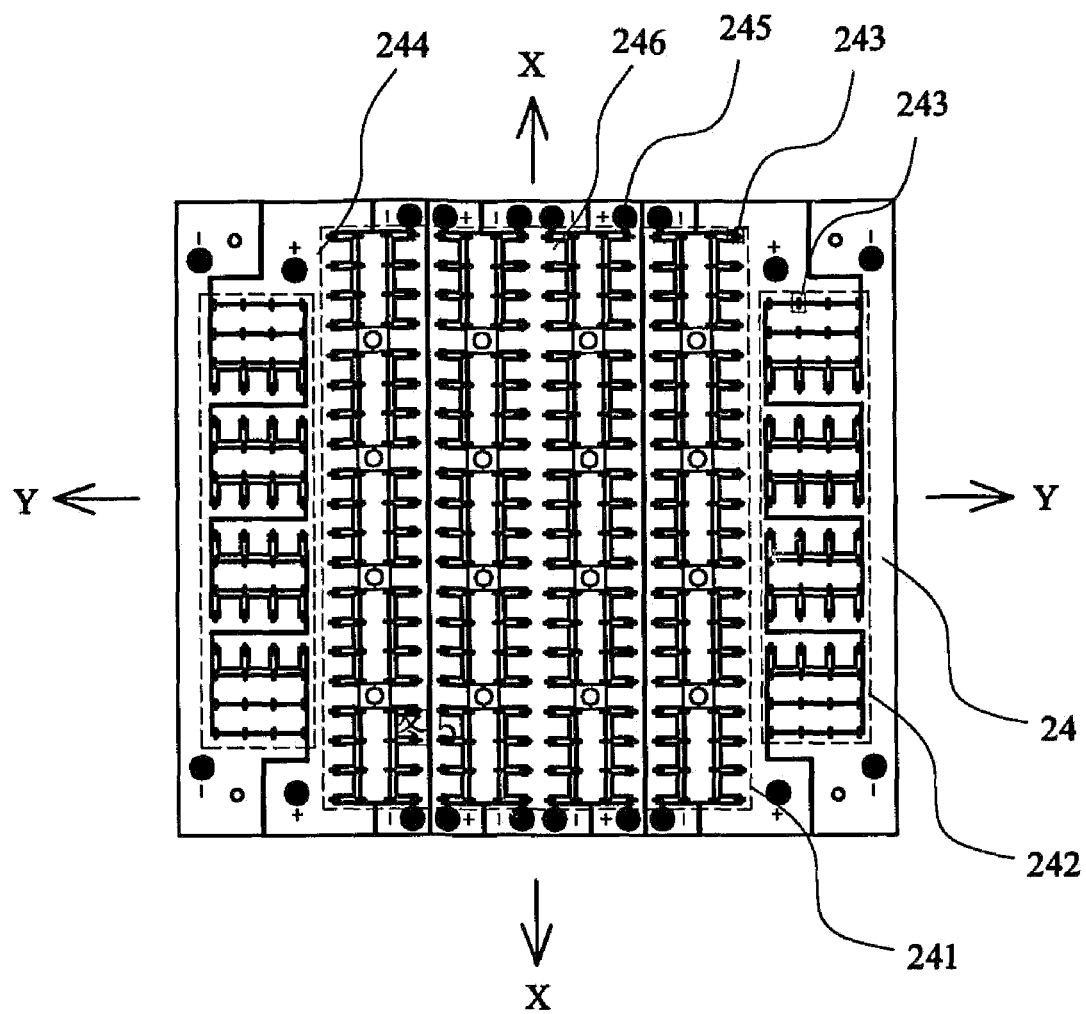
FIG. 5 is a partial schematic view of the circuit layout of a printed circuit board of the LED directional illumination energy-saving luminaire provided by the present invention.

With reference to FIG. 5, an X direction and a Y direction are defined by the plane printed circuit board 24. The printed circuit board 24 is mounted within the luminaire with its X direction along the extending direction of the road and Y direction along the width direction of the road. The printed circuit board 24 has a first illumination unit mounting region 241 located in the middle portion thereof, and two second illumination unit mounting regions 242 symmetrically located at both sides of the first illumination unit mounting region 241 in terms of the Y direction. The first illumination unit mounting region 241 and the second illumination unit mounting regions 242 are respectively provided with a plurality pairs of insertion holes 243 that are arranged at intervals along the X direction and the Y direction. Each pair of insertion holes in the first illumination unit mounting region 241 is arranged along the Y direction, while each pair of insertion holes in the second illumination unit mounting regions 242 is arranged along the X direction, that is, the arranging directions of the pairs of insertion holes in both mounting regions are perpendicular to each other. Each mounting region has multiple groups of common power supply line patterns 244 that are independent from each other. Each group of common power supply line patterns 244 has an independent terminal 245 for the welding of the connecting wire. On the common power supply line pattern 244, typically a relatively large number of LEDs 25 are connected, thus an electric current flowing therethrough is relatively high. By designing the common power supply line pattern 244 in such a manner as to have a square-wave-like profile with a laterally widened portion 246, a larger sectional area can be achieved as compared with the line pattern of straight line shape, so that the current density may be lowered and the amount of heat generated can be effectively reduced. Between the common power supply line patterns 244, there are some line patterns for transitional connections, which line patterns have a relatively lower current, thus relatively narrower lines are used.

Figure 6:
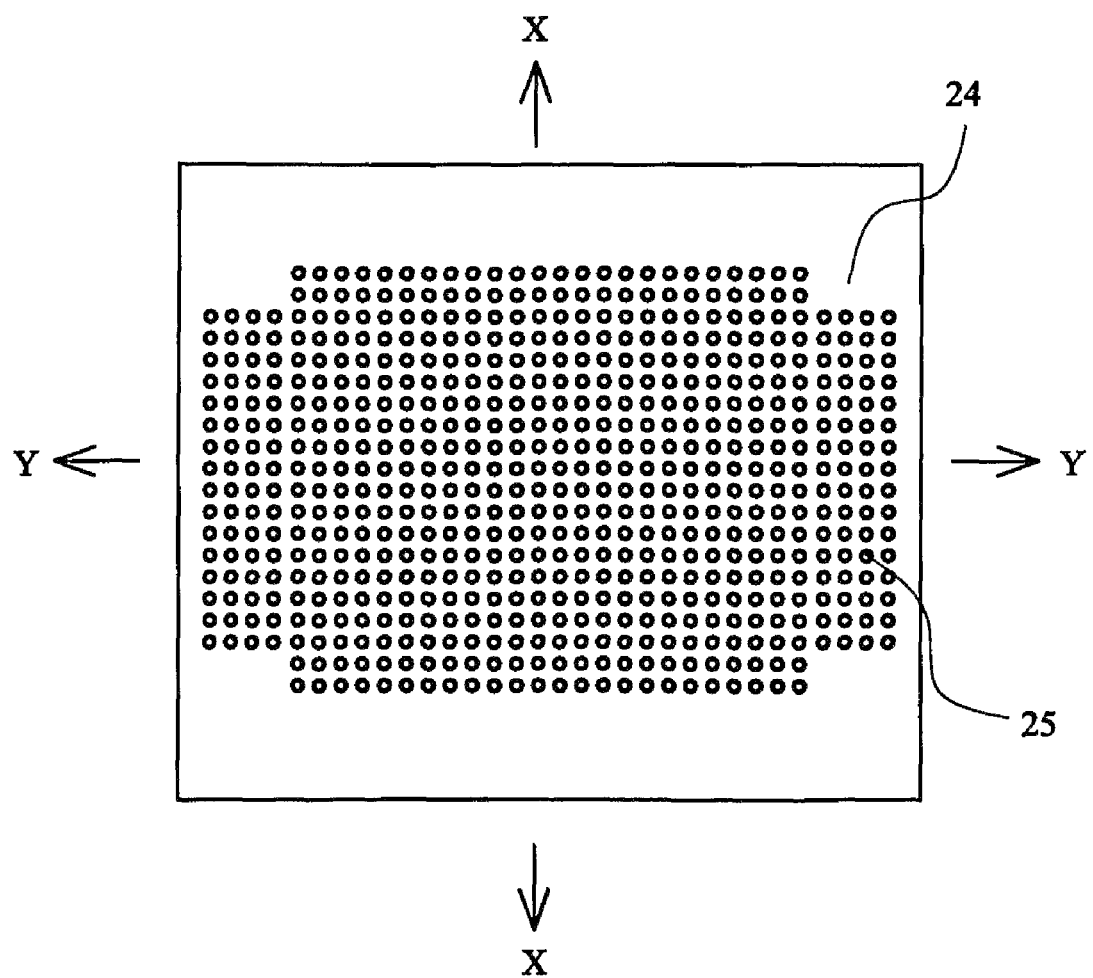
FIG. 6 is a schematic view of the LEDs in a mounted state of the LED directional illumination energy-saving luminaire provided by the present invention.
Figure 7:
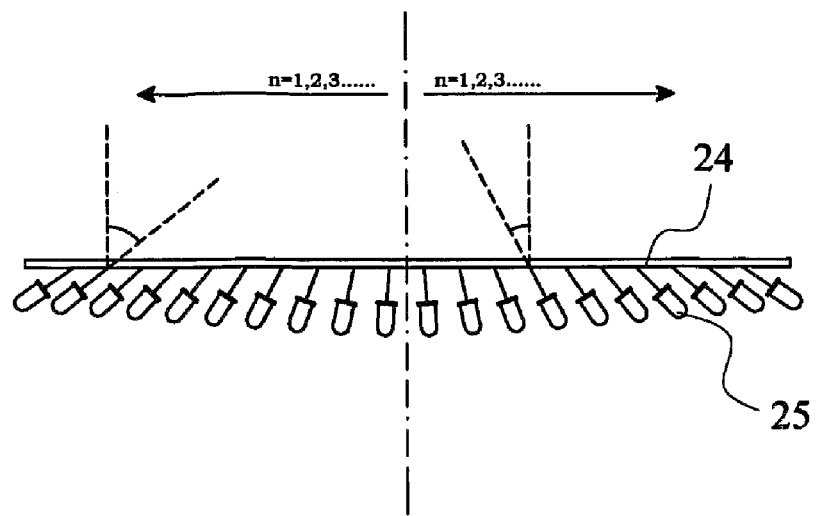
FIG. 7 is a view along a section which is perpendicular to the plane circuit board, and extends along the X direction in FIG. 6.
Figure 8:
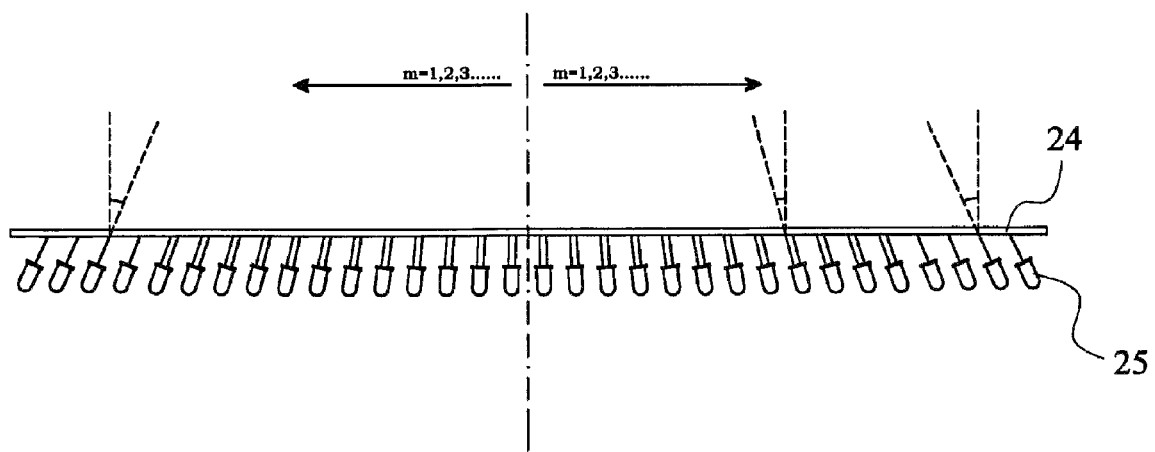
FIG. 8 is a view along a section which is perpendicular to the plane circuit board, and extends along the Y direction in FIG. 6.

With reference to FIG. 6 to FIG. 8, a plurality of LEDs 25 are mounted in both the first illumination unit mounting region 241 and the second illumination unit mounting regions 242 of the printed circuit board 24 so as to form a first illumination unit and 2 second illumination units. Each LED 25 is inserted into a pair of insertion holes of the printed circuit board 24 and is fixed via welding, and the LED 25 is mounted in such a manner that the LED body is at a certain height from the plane circuit board 24 and is tilted with respect to the vertical line. The plurality of LEDs 25 are arranged at intervals in an array along the X direction and the Y direction, and are symmetrically distributed with respect to a center of said array. The LEDs 25 in each mounting region are divided into multiple groups that can be independently controlled. Each LED 25 is respectively deviated by a certain angle from the X direction and the Y direction, based on the projection angle of the luminaire in said X direction and said Y direction. The projection angle of the luminaire in said X direction and said Y direction is determined by the national standards for the design of street lighting and the predetermined range targeted by the illumination. The projection angle of the luminaire in the X direction can be set at 120 degrees. The projection angle of the luminaire in the Y direction is determined by the width of the road surface. The projection angle should have such a magnitude which can guarantee that the light is accurately projected onto the range of the road surface and that the illumination of the light outside of the road surface is avoided.

The slantwise angle $\alpha_n$ of LED 25 as viewed in the section which is perpendicular to the plane circuit board and extends along said X direction, is governed by the following formula:

$$\alpha_n = \text{Arc}tg(tg55 \cdot (n-0.5)/(N/2-0.5))$$

wherein: N is the total columns of the LEDs arranged along the X direction, and n is the sequence number of the column within which the respective LED is located, counted in the order from the center of the array of the LEDs towards the outside along the X direction;

The slantwise angle $\beta_m$ of each LED 25 as viewed in the section which is perpendicular to the plane circuit board and extends along said Y direction, is governed by the following formula:

$$\beta_m = \text{Arc}tg(W \cdot (m-0.5)/M/H)$$

wherein: W is the illumination width of the luminaire along the Y direction, i.e., the width of the road surface to be illuminated, M is the total rows of the LEDs arranged along the Y direction, m is the sequence number of the row within which the respective LED is located, counted in the order from the center of the array of the LEDs towards the outside along the Y direction, and H is the mounting height of the luminaire.

The number of the LED in each mounting region is determined by the mounting height of the luminaire, the width of the road surface, the actual luminous intensity of the LED and the illuminating intensity of the road surface required by the road illumination designer.

Several embodiments are provided as follows:

Embodiment 1

The height of the luminaire from the ground is 8 meters, the width of the road surface is 8 meters, the number of the columns of the LEDs in the X direction is 20, and the number of the rows of the LEDs in the Y direction is 32. In the X direction, with respect to the center of LED array, the respective columns, as approaching the edge of the array, should be bent or tilted respectively at the following degree values of angle: 4.3, 12.7, 20.6, 27.8, 34.1, 39.6, 44.3, 48.4, 52, 55. In the Y direction, with respect to the center of LED array, the respective rows, as approaching the edge of the array, should be bent or tilted respectively at the following degree values of angle: 0.9, 2.7, 4.5, 6.2, 8, 9.8, 11.5, 13.2, 14.9, 16.5, 18.2, 19.8, 21.3, 22.9, 24.4, 25.8.

Embodiment 2

The height of the luminaire from the ground is 12 meters, the width of the road surface is 10 meters, the number of the columns of the LEDs in the X direction is 20, and the number of the rows of the LEDs in the Y direction is 64. In the X direction, with respect to the center of LED array, the respective columns, as approaching the edge of the array, should be bent or tilted respectively at the following degree values of angle: 4.3, 12.7, 20.6, 27.8, 34.1, 39.6, 44.3, 48.4, 52, 55. In the Y direction, with respect to the center of LED array, the respective rows, as approaching the edge of the array, should be bent or tilted respectively at the following degree values of angle: 0.4, 1.1, 1.9, 2.6, 3.4, 4.1, 4.8, 5.6, 6.3, 7.1, 7.8, 8.5, 9.2, 10, 10.7, 11.4, 12.1, 12.8, 13.5, 14.2, 14.9, 15.6, 16.3, 17, 17.7, 18.4, 19, 19.7, 20.4, 21, 21.7, 22.3.

Embodiment 3

The height of the luminaire from the ground is 15 meters, the width of the road surface is 15 meters, the number of the columns of the LEDs in the X direction is 40, and the number of the rows of the LEDs in the Y direction is 64. In the X direction, with respect to the center of LED array, the respective columns, as approaching the edge of the array, should be bent or tilted respectively at the following degree values of angle: 2.1, 6.3, 10.4, 14.4, 18.2, 21.9, 25.5, 28.8, 31.9, 34.8, 37.6, 40.1, 42.5, 44.7, 46.7, 48.6, 50.4, 52, 53.6, 55. In the Y direction, with respect to the center of LED array, the respective rows, as approaching the edge of the array, should be bent or tilted respectively at the following degree values of angle: 0.4, 1.3, 2.2, 3.1, 4, 4.9, 5.8, 6.7, 7.6, 8.4, 9.3, 10.2, 11.1, 11.9, 12.8, 13.6, 14.5, 15.3, 16.1, 16.9, 17.8, 18.6, 19.4, 20.2, 20.9, 21.7, 22.5, 23.3, 24, 24.7, 25.5, 26.2.

When the LED 25 is to be mounted, the LED 25 is at first perpendicularly inserted into the printed circuit board 24, so that the LED body thereof is at a height of 8-10 mm from the plane circuit board 24. One pin of each LED near the symmetrical center of the array is firstly welded and fixed. Then, according to the calculated slantwise angles that are required with respect to the X direction and the Y direction, for LEDs of each column in the X direction and each row in the Y direction, the pins thereof are uniformly bent, respectively, by a sheet such as a stiff and planar plastic plate, so that the LED body is tilted to the plane circuit board 24, finally, the other pin is welded and fixed.

Since each pair of insertion holes in the first illumination unit mounting region 241 is arranged along the Y direction, and each pair of insertion holes in the second illumination unit mounting regions 242 is arranged along the X direction, the pair of pins of each LED 25 mounted in the first illumination unit mounting region 241 is arranged along the Y direction, and the pair of pins of each LED 25 mounted in the second illumination unit mounting regions 242 near the both sides of the circuit board 24 is arranged along the X direction. With such an arrangement, it is assured that each LED 25 can be easily bent in the direction requiring a relatively large slantwise angle.

Figure 9:
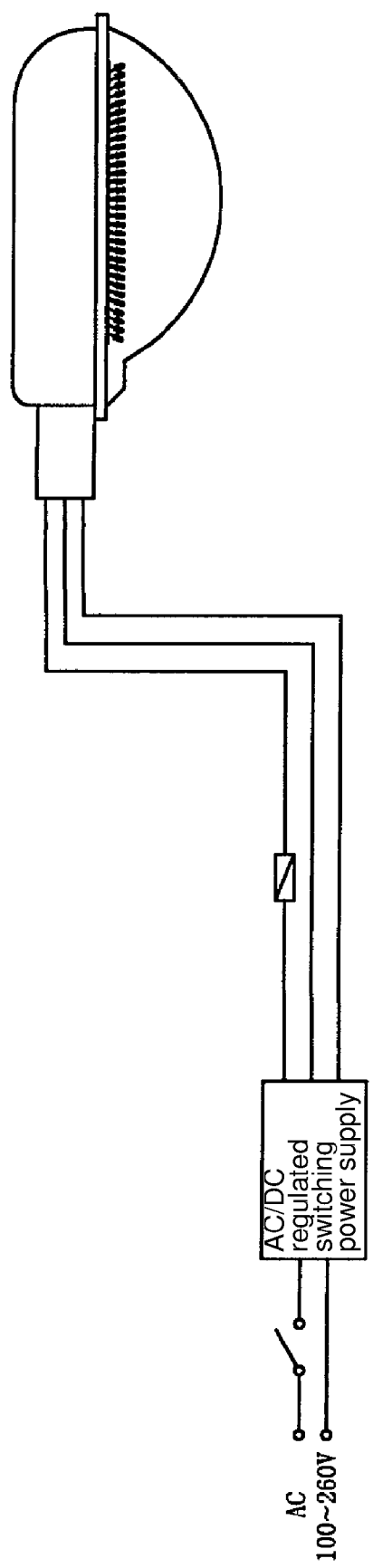
FIG. 9 is a schematic view showing the connection of the LED directional illumination energy-saving luminaire provided by the present invention with an AC power supply system.
Figure 10:
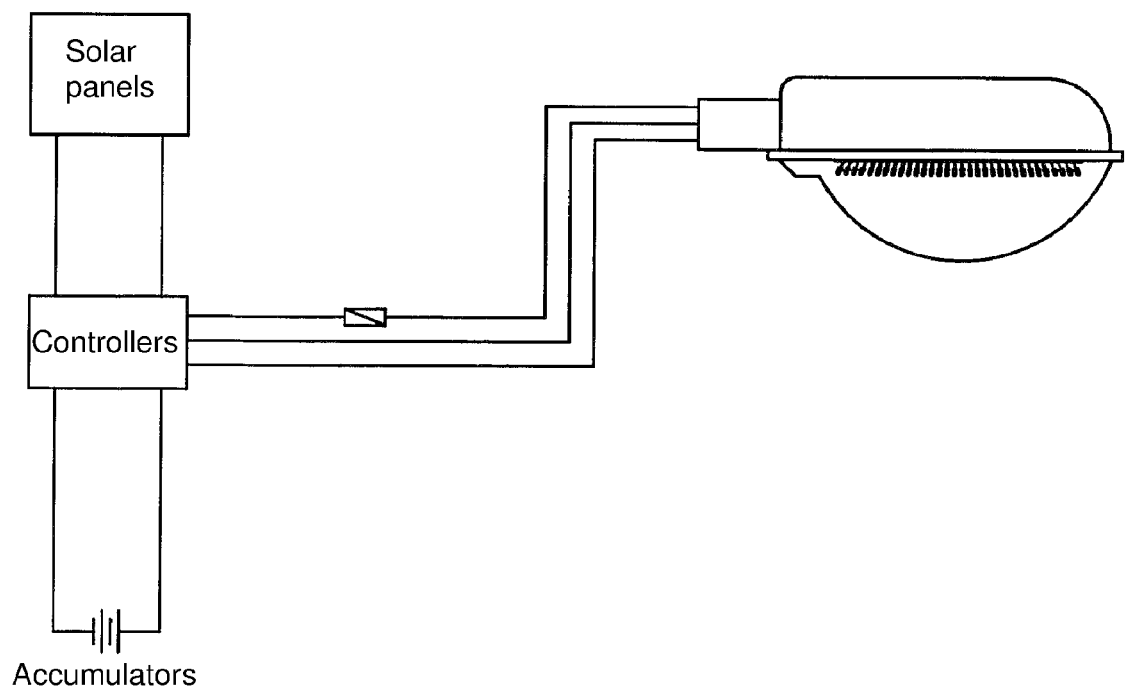
FIG. 10 is a schematic view showing the connection of the LED directional illumination energy-saving luminaire provided by the present invention with a solar energy supply system.

With reference to FIG. 9, the LED directional illumination energy-saving luminaire provided by the present invention can be supplied with power by a 100-260V AC power supply system, in which an AC/DC regulated switching power supply is incorporated so as to improve the power supplying efficiency. With reference to FIG. 10, the LED directional illumination energy-saving luminaire provided by the present invention can also be supplied with power by a solar energy system, the components required by the system such as the solar panels, accumulators and controllers etc. can be reduced by a half as compared with the conventional LED solar energy street lamp, thus the project investment can be greatly reduced, and the application of the LED solar energy street lamp can be facilitated, so as to aid in the popularization of the solar energy street lamp.

In practical, according to different requirements for lighting, the LEDs in the luminaire can be grouped for a timing control. For example, since there are few vehicles running on the street during deep night, to save the electric energy, some LEDs in the luminaire may be turned off during this period, which are then turned on again some time before daybreak. The timing control by group of the LEDs can be achieved as follows: multiple groups of LEDs that are mutually independent are organized into groups, and the terminals 245 of a plurality of common power supply line patterns 244 mutually independent corresponding to each group of LEDs are connected through out-of-board jumper wires, then a general bus wire is led out from each group to be connected with the power supply system, and the timing control by group can be achieved through the controller of the power supply system.

The present invention has been described above in connection with the embodiments thereof, however, the present invention is not limited as such. Any modifications and variations made under the same concept are covered by the scope of protection claimed by the present invention.

I claim:

1. A LED directional illumination energy-saving luminaire, characterized in that, it comprises: a plane circuit board with an X direction and a Y direction defined; and illumination units comprising a plurality of LEDs mounted to said circuit board in a tilted state with LED bodies thereof being positioned at a predetermined height from the plane circuit board, and said plurality of LEDs are arranged at intervals in an array along said X direction and said Y direction and are symmetrically distributed with respect to the center of said array, each of said LEDs is deviated by a predetermined angle with respect to said X direction and said Y direction, thereby allowing said illumination units having predetermined projection angles in said X direction and said Y direction, respectively;

said illumination units comprise a first illumination unit located in the middle area of said circuit board and second illumination units that are symmetrically arranged at both sides of said first illumination unit, each of said illumination units comprises a plurality of LEDs mounted to said circuit board in a tilted state with LED bodies thereof being positioned at a predetermined height from the plane circuit board, said plurality of LEDs of each of said illumination units are arranged in an array with predetermined intervals therebetween along said X direction and said Y direction and are symmetrically distributed with respect to the center of said array, each of said LEDs is deviated by a predetermined angle with respect to said X direction and said Y direction, thereby allowing said illumination units having predetermined projection angles in said X direction and said Y direction, respectively;

the slantwise angle $\alpha_n$ of each of said LEDs as viewed in the section which is perpendicular to the plane circuit board and extends along said X direction, is governed by the following formula:

$\alpha_n$=arc tangent(tangent55 degrees·$(n-0.5)/(N/2-0.5)$)

wherein: N is the total columns of said LEDs arranged along said X direction, and n is the sequence number of the column within which said LED is located, counted in the order from the center of the array of the LEDs towards the outside along said X direction; and the slantwise angle $\beta_m$ of each of said LEDs as viewed in the section which is perpendicular to the plane circuit board and extends along said Y direction, is governed by the following formula:

$\beta_m$=arc tangent($W\cdot(m-0.5)/M/H$)

wherein: W is the illumination width of said luminaire along said Y direction, M is the total rows of said LEDs arranged along said Y direction, m is the sequence number of the row within which said LED is located, counted in the order from the center of the array of the LEDs towards the outside along said Y direction, and H is the mounting height of said luminaire.

2. The LED directional illumination energy-saving luminaire according to claim 1, characterized in that, the projection angle of said illumination units in said X direction is 120 degrees.

3. The LED directional illumination energy-saving luminaire according to claim 1, characterized in that, said LED is a light-emitting diode with its beam projection angle less than or equal to 15 degrees.

4. The LED directional illumination energy-saving luminaire according to claim 1, characterized in that, said LED is a light-emitting diode with a luminous intensity higher than or equal to 20,000 mcd.

5. The LED directional illumination energy-saving luminaire according to claim 1, characterized in that, said circuit board is formed thereon with a first illumination unit mounting region and second illumination unit mounting regions, in said first illumination unit mounting region and said second illumination unit mounting regions there are respectively provided with a plurality of pairs of insertion holes that are arranged at intervals along said X direction and said Y direction respectively, the arranging direction of said pairs of insertion holes in said first illumination unit mounting region and that of said pairs of insertion holes in said second illumination unit mounting regions are perpendicular with each other, and said LEDs are inserted within said pairs of insertion holes of said circuit board and welded therein.

6. The LED directional illumination energy-saving luminaire according to claim 1, characterized in that, said plurality of LEDs of said illumination units are divided into multiple groups that can be independently controlled.

7. The LED directional illumination energy-saving luminaire according to claim 6, characterized in that, said circuit board has multiple groups of common power supply line patterns that are mutually independent, each group of said common power supply line patterns has an independent terminal.

8. The LED directional illumination energy-saving luminaire according to claim 7, characterized in that, said common power supply line pattern has a laterally widened portion with a square-wave-like profile.

9. The LED directional illumination energy-saving luminaire according to claim 1, characterized in that, it also comprises: a lamp body, which has a hollow shell formed by a pedestal and a transparent lampshade; and an apertured substrate for mounting said circuit board, as the substrate being provided within said shell and forming heat dissipation channels between itself both with said pedestal and with said transparent lampshade.

* * * * *